United States Patent [19]

Nishimoto

[11] Patent Number: 5,289,036
[45] Date of Patent: Feb. 22, 1994

[54] RESIN SEALED SEMICONDUCTOR INTEGRATED CIRCUIT

[75] Inventor: Shozo Nishimoto, Tokyo, Japan
[73] Assignee: NEC Corporation, Tokyo, Japan
[21] Appl. No.: 823,469
[22] Filed: Jan. 22, 1992
[30] Foreign Application Priority Data Jan. 22, 1991 [JP] Japan .................. 3-005470

[51] Int. Cl.$^5$ ............... H01L 23/48; H01L 29/44
[52] U.S. Cl. .................. 257/774; 257/773; 257/775; 257/734
[58] Field of Search ............. 357/68, 71, 45; 257/774, 775, 773

[56] References Cited

U.S. PATENT DOCUMENTS

| 4,467,345 | 8/1984 | Ozawa | 257/775 |
| 4,475,119 | 10/1984 | Kuo et al. | 357/45 |
| 4,583,111 | 4/1986 | Early | 357/68 |
| 4,631,571 | 12/1986 | Tsubokura | 357/71 R |
| 4,654,692 | 3/1987 | Sakurai et al. | 257/775 |
| 4,739,388 | 4/1988 | Packeiser et al. | 357/45 |
| 4,970,572 | 11/1990 | Kato et al. | 257/775 |

FOREIGN PATENT DOCUMENTS 60-59774  6/1985  Japan .
61-258449 11/1986  Japan .

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

A wiring layer structure of a resin sealed semiconductor integrated circuit, which is free from slide of wiring layer during heat cycle test, is disclosed. The slide is prevented by making an effective width of the wiring layer smaller by means of slits formed in the wiring layer. A reduction of area to be occupied by the wiring layer is realized by reducing a total width of the wiring layers by increasing the density of slits with increase of a distance from a corner of the chip.

9 Claims, 3 Drawing Sheets

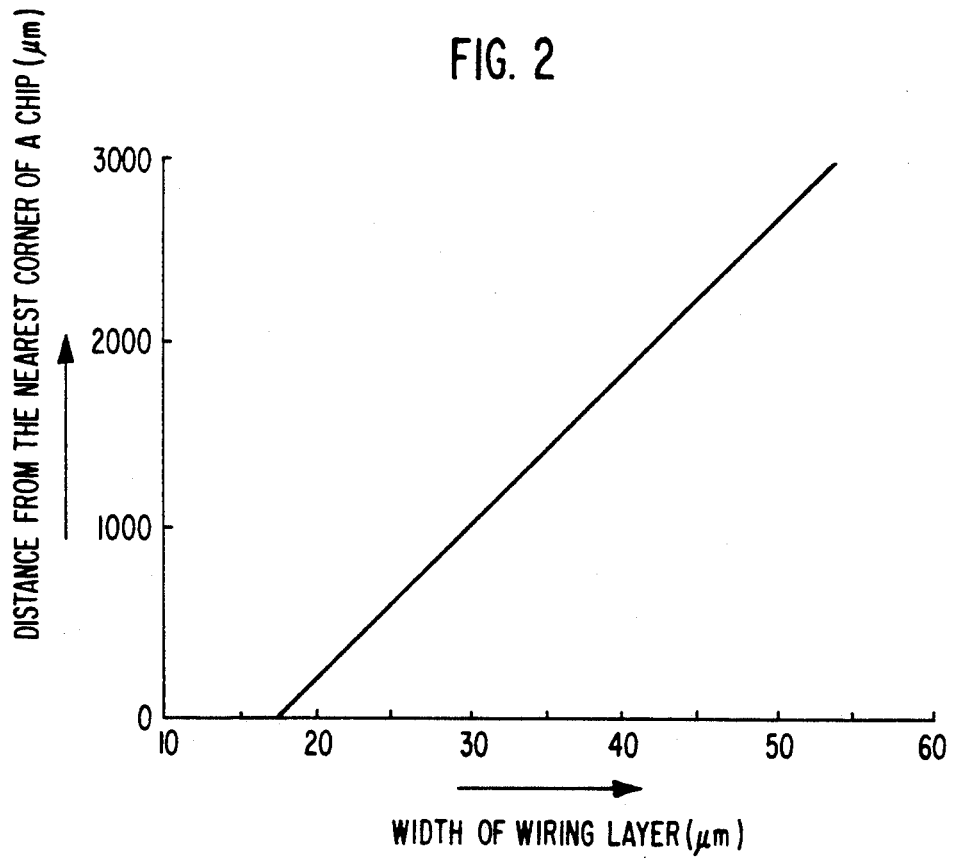

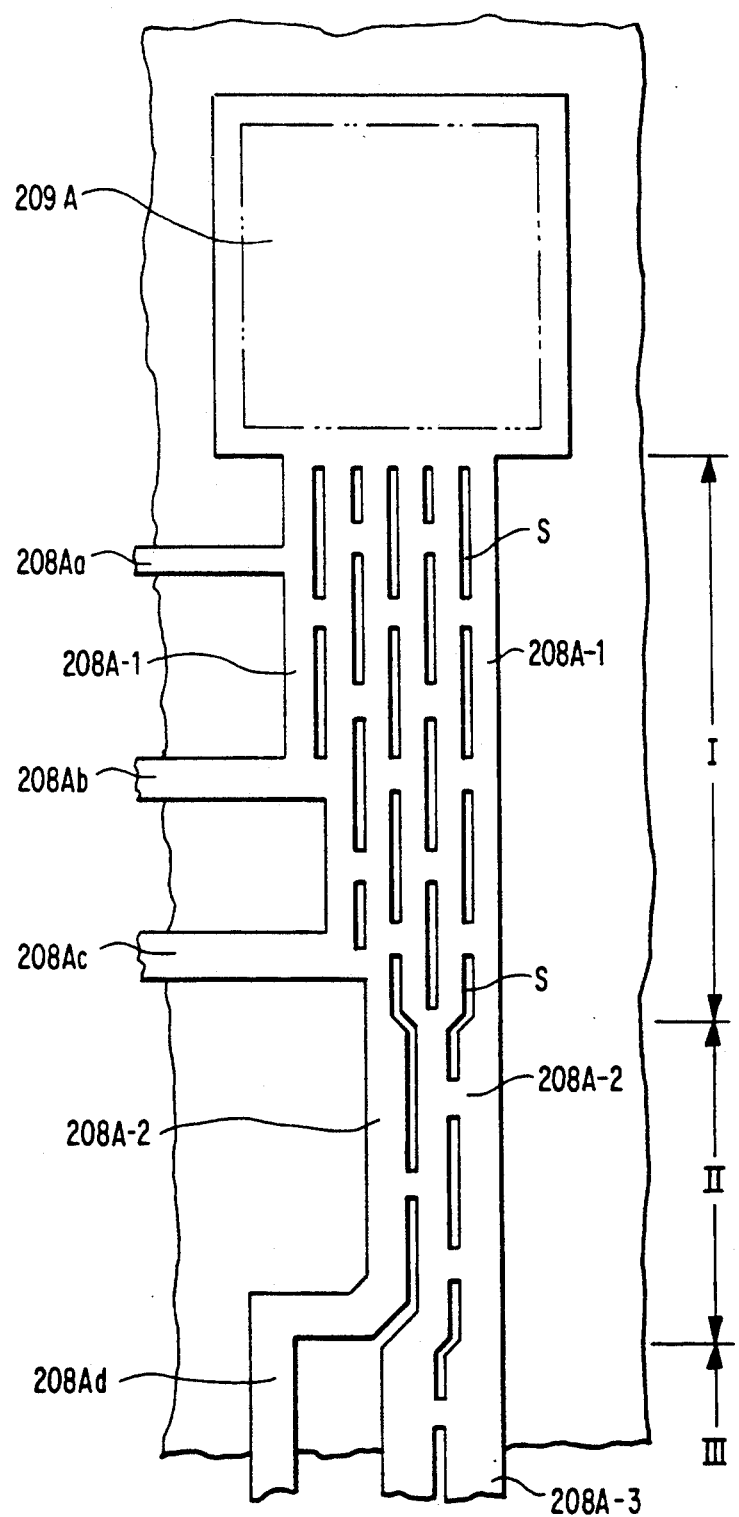

RESIN SEALED SEMICONDUCTOR INTEGRATED CIRCUIT

BACKGROUND OF THE INVENTION

The present invention relates to a resin sealed semiconductor integrated circuit.

In a semiconductor integrated circuit chip (referred to as semiconductor chip hereinafter), a wiring layer of a metal film such as aluminum or copper or an alloy film led from bonding pads is used as a ground wiring or a power supply wiring for supplying an externally supplied power source potential to an internal circuit node. Due to the necessity of making resistance low and life until breakage due to electromigration long enough, practically, such power source wiring or ground wiring is made as wide as possible. Further, in order to prevent wirings connecting leads to bonding pads from being tangled, the bonding pads are arranged in a peripheral portion of the semiconductor chip. The wiring layer is coated with a passivation film of a hard material such as phospho-silicate glass (PSG) or silicon nitride to prevent errosion by water (water vapor). Then, the semiconductor chip is adhered to a metal plate called an island by means of conductive material and, after necessary connections are made by means of leads and wires, it is resin-sealed.

The passivation film functions to not only prevent water immigration but also to protect semiconductor circuit elements against contamination by substances contained in the sealing resin. Therefore, the thickness of the passivation film is designed to a value of about 1 $\mu$m or more. With such large thickness of the passivation film, the latter on wiring layers tends to be cracked as pointed out in U.S. Pat. No. 4,467,345 issued to Ozawa on Aug. 21, 1984 and assigned to Nippon Electric Co., Ltd. This problem is due to the fact that grain size of the passivation film becomes larger on the wiring layers. This problem may be solved by limiting the width of wiring layer smaller than 50 $\mu$m.

The crack problem of the passivation film as well as slide or destruction of the wiring layer also occurs in assembling step of the chip, such as resin sealing step. Such phenomena are due to difference in thermal expansion coefficient between a semiconductor chip and a resin seal. However, such problems are also solved by providing slits so that an effective width of portions of the wiring layer at corner portions of the semiconductor chip are made not less than 10 $\mu$m and not more than 40 $\mu$m, as disclosed in international publication Gazette WO 91/00616.

Further, such destruction and/or slide of wiring layers may occur during a heat cycle test for confirming reliability of a semiconductor chip under severe thermal conditions such as its use on a vehicle or in a.desert, which is to be performed after resin sealing. This is solved by limiting the width of wiring layer not more than 5 $\mu$m as disclosed in JP-A-62-174948. Since the width reduction of wiring layer necessarily increase possibility of breakage of wiring layer due to electromigration, it is usual to use a plurality of narrow parallel wiring layers instead of a single wide wiring layer. However, this approach, in which the width of each narrow wiring is not more then 5 $\mu$m increases an area to be occupied by the wiring layers, causing an improvement of integration density to be difficult.

There is the trend, in the field of semiconductor integrated circuit, of both increase of integrated circuit scale and miniturization thereof. For example, for a semiconductor memory, while the number of bits for each memory element is increased at a rate of four times per several years, the increase of chip area is restricted to twice at most owing to miniturization of constitutional elements.

Further, recent power source current becomes substantially constant, say, 100 mA, regardless of bit number. The thickness of wiring layer tends to decrease with increase of bit number. Since electromigration depends upon current density, the width of wiring layer constituting a power source wiring and a ground wiring (the width is a total width of a plurality of narrow parallel wiring layers corresponding to a single wide wiring layer) can not be reduced with increase of bit number. This is obstructive to improvement of integration density of power source wiring and ground wiring. Such problem may be avoided by providing a plurality of conductor sets each including power source wiring, ground wiring and bonding pads. On the other hand, the number of lead wires increases necessarily with increase of semiconductor integrated circuit scale such as increase of bit number, while the number of leads per package is limited. Therefore, the above-mentioned approach is not preferable.

As other approaches than those mentioned above in which the width of wiring layer is reduced to prevent destruction or slide of wiring layers in a resin sealed semiconductor device, the following approaches are proposed:

A first approach is to coat the passivation film with polyimide film. Although this approach had been developed to prevent soft-error due to radiation, it has been found that this is also effective to relax stress exerted on a structure including the passivation film and the wiring layer to thereby prevent destruction or slide of the wiring layer. This method, however, requires the additional step of coating the passivation layer with polyimide film.

A second approach is to flatten a cover layer. That is, after a usual passivation film such as PSG film which has water repelling function and flatness of which is low is provided, a SOG (Spin-On-Glass) film is formed thereon to improve the surface flatness. With this method, it has been proved that, with such improved flatness, the destruction of wiring layer is reduced. The reason why such effect is provided is that, contrary to the stress relaxation of the polyimide film, the SOG film fills portions of the passivation film on side faces of wiring layer in which coverage is low and film thickness is small, causing mechanical strength to be increased. This method also requires such additional step.

These two methods have been not used widely for, not only the economical reason of requirement of additional step, but also reasons that manufacturers had neither effective techniques for formations of polyimide coating and passivation film having acceptable coverage nor knowledges of the aforementioned effects of the polyimide film and the flat cover film.

A method which has been used widely is to provide wiring layer on a chip except corners thereof and their peripheries where destruction of wiring layer may occur. On these portions of the chip, bonding pads and a minimum wiring layer may be provided. Since, in this conventional method, non-use portions may be left in a peripheral portion of the chip, the chip area is increased so that a minimum wiring layer might be destroyed.

BRIEF SUMMARY OF THE INVENTION

Therefore, an object of the present invention is to provide a resin sealed semiconductor integrated circuit which can be realized without adding any special step and can minimize the undesired effect on the integration density caused by constituting a power source wiring, etc., with a plurality of narrow parallel wiring layers.

The resin sealed semiconductor integrated circuit includes a power source wiring or a ground wiring comprising wiring layers a total width of which is non-continuously reduced with increase of distance from a closest corner of a semiconductor chip to the wiring and means for separating the wiring layer to a plurality of sections in width direction with the number of sections being dependent on the distance from the chip corner. The wiring layers are coated with a passivation film. The separating means is preferably slits each having width at least twice a thickness of the passivation film.

The possibility of slide of wiring layer is higher in a portion of a chip closer to a corner thereof and with wider the wiring layer. Since the wiring layer is sectioned by the slits, its effective width with respect to slide causing stress becomes small enough to prevent slide. Further, since the width of the wiring layer is narrowed non-continuously with a distance from the corner portion, it is possible to reduce an area to be occupied by power source wiring, etc.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein:

FIG. 2 is a graph showing a relation between an upper limit of width and a distance from a nearest corner, with which wiring layer may slide; and FIG. 3 is a plan view schematically showing a modification of the embodiment of the present invention.

DETAILED DESCRIPTION OF THE PREFERRED EMBODIMENTS

A first embodiment of the present invention will be described with reference to FIGS. 1A and 1B.

Figure 1A:
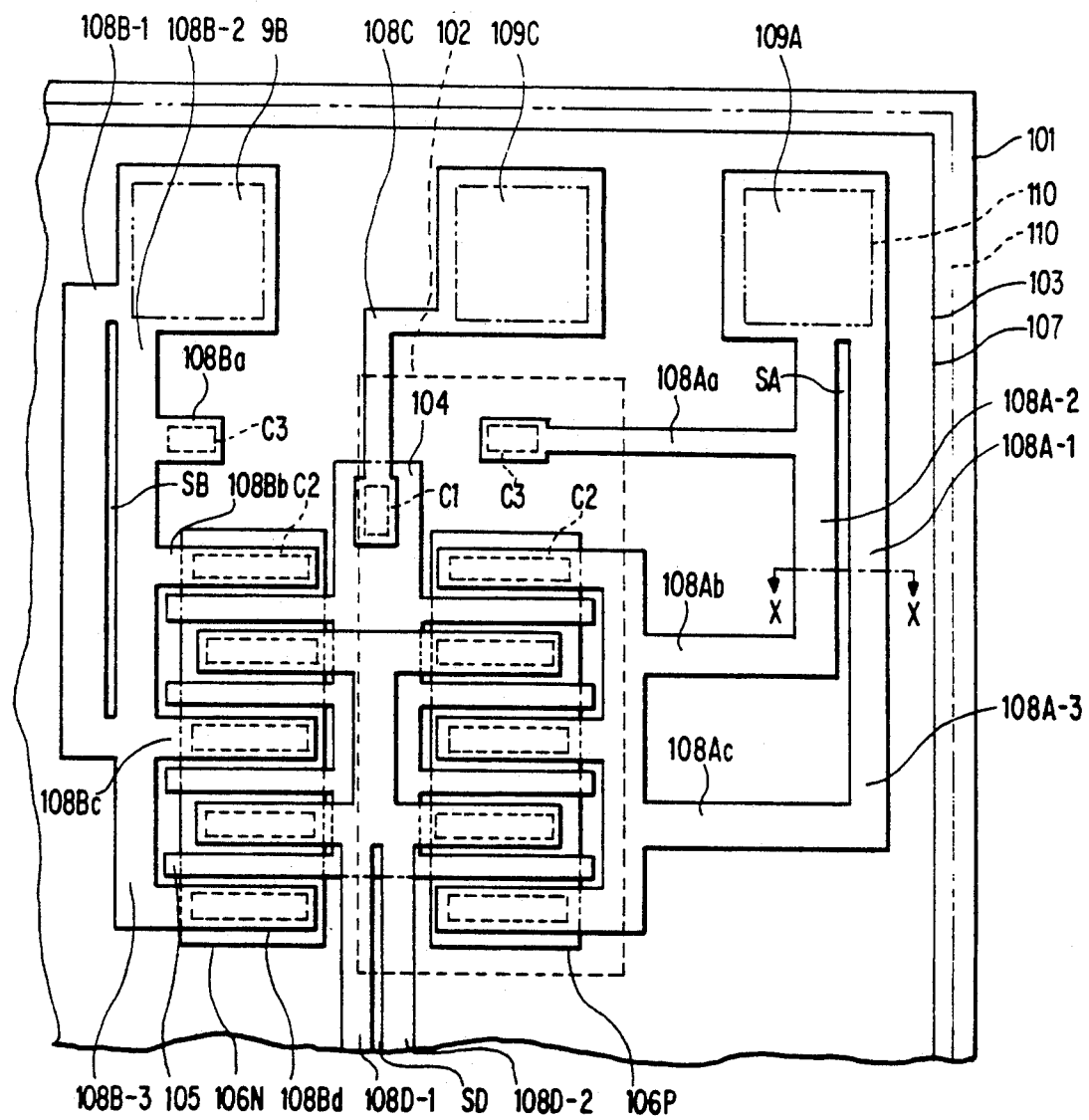
FIG. 1A is a plan view showing schematically an embodiment of the present invention.
Figure 1B:
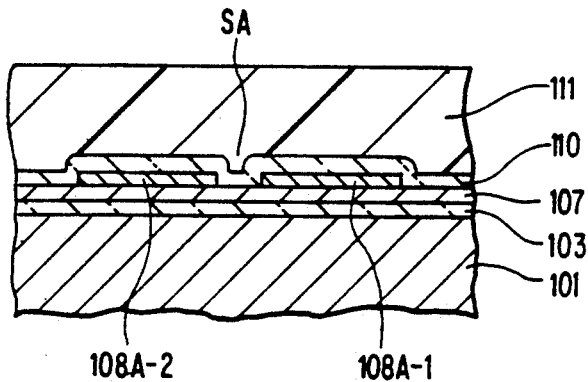
FIG. 1B is an enlarged cross section taken along a line X—X in FIG. 1A.

In FIGS. 1A and 1B, a sealing resin of a package is omitted and only an end portion of a passivation film 110 is shown by a dotted line, for clarification of illustration.

An N well 102 is formed in a surface area of a rectangular P type monocrystal silicon substrate 101 of a size 6.0 mm×15.4 mm. Active regions 106N and 106P are provided by selectively forming a field oxide film 103. Gate oxide films which are not shown are provided on surfaces of the active regions 106N and 106P. A gate electrode 104 is formed of a polysilicon film having a portion traversing the active regions 106N and 106P through the gate oxide films. In the active regions 106N and 106P, an N type source-drain region and a P type source-drain region are formed in self alignment with branch portions of the gate electrode 104, respectively. The P type monocrystal silicon substrate having the field oxide film 103 and the gate electrode 104 formed thereon is covered with an interlayer insulating film 107. Wiring layers 108A-1, 108A-2 and 108A-3 and bonding pads 109A, 109B and 109C are formed by an Al-Si alloy film (containing 1% Si) having thickness of 1 μm and attached to the interlayer insulating film 107. A through-hole C1 connects the Al-Si alloy film to the gate electrode 104, a through-hole C2 connects the Al-Si alloy film to the source-drain region 106N or 106P and a through-hole C3 connects the Al-Si alloy film to the N well 102 or the P type monocrystal silicon substrate 101. The passivation film 110 takes in the form of a silicon nitride film 1 μm thick and covering substantially whole surface of the semiconductor chip except center portions of the bonding pads 109A, 109B and 109C and a sealing resin 111 is a mixture of epoxy resin and filler. An area of each of the bonding pads 109A, 109B and 109C is about 120 μm×120 μm and connected through wires, not shown, to leads to be used as a power source terminal, not shown, to leads to be used as a ground terminal and to leads used as signal input terminals.

A power source wiring connected to the bonding pad 109A arranged in the vicinity of a corner of the semiconductor chip is arranged along a shorter side of the rectangular semiconductor chip and has a wide main portion constituted with two wiring layers 108A-1 and 108A-2 separated from each other by a slit SA. A wiring layer 108Aa is branched from the wiring layer 108A-2 and supplies current to a CMOS inverter. A width of each of the wiring layers 108A-1, 108A-2, 108A-3, 108Ab and 108Ac is about 10 μm and a width of the slit SA is from 2 μm to 6 μm and, preferably, 4 μm.

A signal input wiring from the bonding pad 109C is a wiring layer 108C 5 μm wide and is connected to a gate (104) of the CMOS inverter.

The ground wiring connected to the bonding pad 109B includes a wide main portion constituted with two wiring layers 108B-1 and 108B-2 separated from each other by a slit SB. The wiring layers 108Ba and 108Bb are branched from the wide main portion of the ground wiring and connected to the P type monocrystal silicon substrate and a ground of the CMOS inverter, respectively. Similarly, wiring layers 108Bc and 108Bd are branched from the wide main portion of the ground wiring and a narrow main portion (wiring 108B-3), respectively, and connected to the ground end of the CMOS inverter. A width of each of the wiring layers 108B-1, 108B-2 and 108B-3 is about 10 μm and a width of the slit SB is from 2 μm to 6 μm and, preferably, 4 μm.

An output wiring of the CMOS inverter has wiring layers 108D-1 and 108D-2 each 10 μm wide and separated from each other by a slit SD. When there are a plurality of loads of this CMOS inverter, these wiring layers are branched to a corresponding number of wiring layers each having width suitable to current consumption of an associated load.

Slide of a wiring layer occurs more frequently when its width is larger and its position is closer to a corner of a chip. FIG. 2 shows an upper limit Wmax (μm) of width of a wiring layer and a distance X (μm) from a closest corner of a chip, which are estimated on the basis of a heat cycle test conducted on a semiconductor chip having area of 6.0 mm×15.4 mm and thickness of 0.4 mm sealed to an SOJ (Small Outline Package) of 350 mil. A straight line A is given by X=82 Wmax−1445. In other words, by setting the width W of the wiring layer to a value satisfying inequality W≦17.6+X/82, slide of wiring layer during heat cycle test can be avoided.

Since, in the embodiment mentioned above, the width of each wiring layer is 10 μm or less, slide can be prevented. For a wiring such as power source wiring or ground wiring whose current consumption is large, the total width thereof is made larger at a position nearer the bonding pad to which current is supplied. However, since current is supplied to a load through the branched narrower wiring, the total width thereof becomes smaller with increase of distance from the bonding pad. Therefore, while possible wiring breakage due to electromigration is restricted, it is possible to remove an impediment against increase of integration density by merely arranging narrow wiring layers in parallel.

In FIG. 1A, the bonding pads 109B is located sufficiently far from the semiconductor chip corner and thus the slit SB may be unnecessary. However, since a bonding pad for ground wiring is generally not always provided in a position remote from a corner of a chip, such slit may be necessary in general sense.

FIG. 3 is a plan view of a modification of the embodiment mentioned above in which a single CMOS inverter is connected to the power source wiring. This modification is suitable when a plurality of loads are connected to the power source wiring. The size of a bonding pad 209A for power source and the position thereof on a semiconductor chip are the same as those of the bonding pad 109A of the embodiment. Wiring layers 208A*a*, 208A*b* and 208A*c* correspond to the wiring layers 108A*a*, 108A*b* and 108A*c*, respectively. A main portion of the power source wiring is divided by slits S into a plurality of wiring layers 208A-1 each 5 μm wide in a region I adjacent to the bonding pad 209A (region from about 200 to 400 μm from a corner of a semiconductor chip), into wiring layers 208A-2 each 7.5 μm wide in a region II remote from a corner by about 400 to 700 μm and into wiring layers 208A-3 each 10 μm wide in a region III adjacent the region II. As shown in FIG. 3, each of the slits is divided by bridging portions that interconnect adjacent wiring layers. A branched wiring layer 208A*d* (7.5 μm wide) is connected to a load, not shown. Thus, the width of the wiring layer increases with increase of the distance from the corner of the semiconductor chip and the bonding pad thereon, resulting in no slide of the wiring layer.

In the above description, the narrower the slit results in the smaller the area to be occupied by the wiring. However, when the slit width is set to a value equal to twice the thickness of the passivation film (usually about 1 μm or more) or less, the possibility of formation of a void in the passivation film in the slit portion increases and the chip becomes mechanical strength of the film becomes low, causing cracks to be formed, resulting in loss of passivation effect. Further, as material of the wiring layers, metal films or alloy films other than the Al-Si alloy film, such as Ao-Si-Cu alloy, which are generally used in semiconductor integrated circuits, may be used. The slit for dividing wiring layers may be replaced by recesses for locally thinning the wiring layer. The passivation film can be formed by not the silicon nitride film but a silicon oxynitride film. Further, although in the described embodiment, the wiring layer is a single layer, the present invention is applicable to a semiconductor integrated circuit having multi-layer wiring structure.

Although the present invention has been described with reference to specific embodiments, this description is not meant to be construed in a limiting sense. Various modifications of the disclosed embodiments, as well as other embodiments of the present invention, will become apparent to person skilled in the art upon reference to the description of the present invention. It is therefore contemplated that the appended claims will cover any modifications or embodiments as fall within the true scope of the present invention.

What is claimed is:

1. A semiconductor device comprising a semiconductor substrate having a corner, a bonding pad formed on an insulating film covering said semiconductor substrate near said corner of said semiconductor substrate, a wiring layer extended from said bonding pad and elongated on said insulating film in a predetermined direction, said wiring layer having a first portion near to said bonding pad and a second portion far from said bonding pad, a first plurality of first slits formed in said first portion of said wiring layer to form a plurality of first wiring segments, said first wiring segments being arranged in parallel to each other in said predetermined direction and each having a first width, and a second plurality of second slits formed in said second portion of said wiring layer to form a plurality of second wiring segments, said second wiring segments being arranged in parallel to each other in said predetermined direction and each having a second width, the number of said first plurality of first slits being larger than the number of said second plurality of said second slits, and said first width being smaller than said second width.

2. The semiconductor device, as claimed in claim 1, wherein each of said first slits is divided into a plurality of parts by bridging sections so that adjacent segments of said first wiring segments are connected to each other via said bridging sections of each of said first slits.

3. The semiconductor device as claimed in claim 2, wherein each of said second slits is divided into a plurality of parts by bridging sections so that adjacent segments of said second wiring segments are connected to each other via said bridging sections of each of said second slits.

4. The semiconductor device as claimed in claim 1, wherein said wiring layer is decreased in width in a stepwise manner, so that said first portion of said wiring layer has a width larger than the width of said second portion of said wiring layer.

5. The semiconductor device as claimed in claim 4, wherein said wiring layer further includes a third portion elongated from said second portion with a width smaller than the width of said second portion, and said semiconductor device further comprising a third plurality of slits formed in said third portion of said wiring layer to form a plurality of third wiring segments, said third wiring segments being arranged in parallel to each other in said predetermined direction and each having a third width larger than each of said first and said second width.

6. The semiconductor device as claimed in claim 5, wherein said wiring layer further has first, second, and third internal wiring layers branched from said first, second, and third portions, respectively.

7. A semiconductor device comprising:
a semiconductor substrate having a corner; an insulating film covering said semiconductor substrate; an element region selectively formed in said semiconductor substrate; a through-hole selectively formed in said insulating film to expose a part of said element region, an electrode formed in contact with said part of said element region via said through-hole and elongated over said insulating film; a bonding pad formed on said insulating film near said corner of said semiconductor substrate; a first wiring layer formed on said insulating film from said bonding pad to said electrode; a second wiring layer formed on said insulating film from said bonding pad to said electrode independently of and separately from said first wiring layer; an additional element region selectively formed in said semiconductor substrate; an additional through-hole selectively formed in said insulating film; and a third wiring layer branched from said first wiring layer and connected to said additional element region through said additional through-hole.

8. The semiconductor device as claimed in claim 7, wherein said additional element region is a well having a field effect transistor therein and said element region is a source region of said field effect transistor.

9. The semiconductor device as claimed in claim 8, further comprising a second bonding pad formed on said insulating film near said bonding pad and a fourth wiring layer connecting said second bonding pad to a gate electrode of said field effect transistor.

* * * * *